United States Patent
Vimpari et al.

(10) Patent No.: US 7,474,902 B2
(45) Date of Patent: Jan. 6, 2009

(54) METHOD OF CONTROLLING TRANSMISSION POWER AND SUBSCRIBER EQUIPMENT

(75) Inventors: Markku Vimpari, Oulu (FI); Jari Vallström, Oulu (FI); Pekka Kuure, Espoo (FI)

(73) Assignee: Nokia Corporation, Espoo (FI)

( * ) Notice: Subject to any disclaimer, the term of this patent is extended or adjusted under 35 U.S.C. 154(b) by 935 days.

(21) Appl. No.: 10/869,674

(22) Filed: Jun. 15, 2004

(65) Prior Publication Data

US 2005/0009552 A1    Jan. 13, 2005

(30) Foreign Application Priority Data

Jun. 18, 2003    (EP)    ................... 03101777

(51) Int. Cl.
*H04Q 7/32*    (2006.01)
(52) U.S. Cl. .................. 455/522; 455/69; 455/68; 455/115.1; 455/126; 455/127.1
(58) Field of Classification Search .................. 455/522, 455/69, 516, 507, 500, 91, 115.1, 115.3, 455/126, 127.1, 127.5, 422.1, 403, 68, 95
See application file for complete search history.

(56) References Cited

U.S. PATENT DOCUMENTS

| 5,369,789 | A | * | 11/1994 | Kosugi et al. ............... 455/126 |
| 5,621,763 | A | * | 4/1997 | Walczak et al. ............. 375/312 |
| 5,732,334 | A | | 3/1998 | Miyake |
| 6,985,751 | B2 | * | 1/2006 | Bartl et al. ................... 455/522 |

FOREIGN PATENT DOCUMENTS

| WO | WO 01/28125 A1 | 4/2001 |
| WO | WO 03/52968 A1 | 6/2003 |

* cited by examiner

*Primary Examiner*—Keith T Ferguson
(74) *Attorney, Agent, or Firm*—Hollingsworth & Funk, LLC

(57) ABSTRACT

The invention relates to a method and subscriber equipment of controlling transmission power in the transmitter. The subscriber equipment transmits bursts with different activity. The subscriber equipment forms an average activity of the transmitter, and controls transmission power of the bursts as a function of the average activity of the transmitter.

16 Claims, 3 Drawing Sheets

METHOD OF CONTROLLING TRANSMISSION POWER AND SUBSCRIBER EQUIPMENT

FIELD

Figure 1:
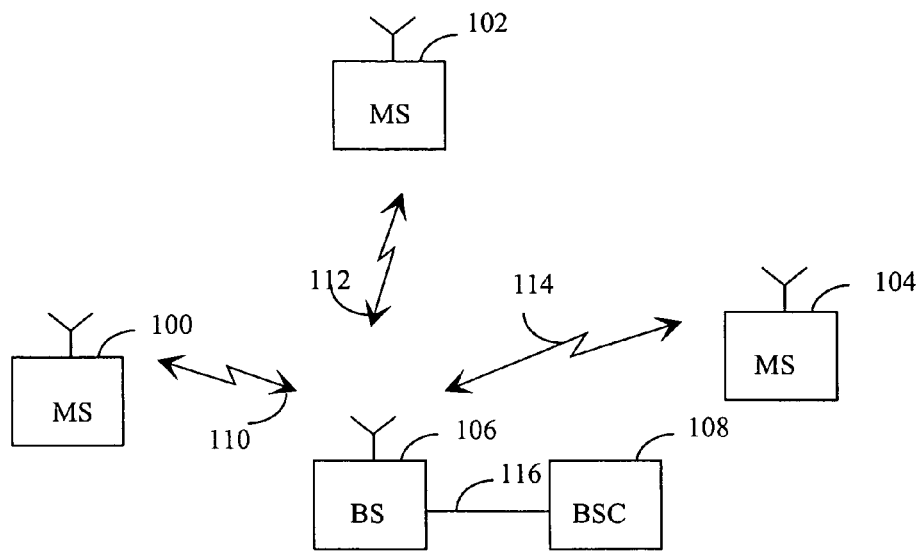

The invention relates to a radio system where a transmitter of subscriber equipment is capable of transmitting bursts with different activity.

BACKGROUND

In a radio system subscriber equipment communicates with base stations. During communication the subscriber equipment transmits bursty signals to the base station through an antenna. Between bursts the transmitter is not transmitting. A major part of total energy in the subscriber equipment is consumed by the transmitter. The high energy consumption still increases the longer the transmitter is continuously transmitting or the more frequently the bursts are transmitted. For example, in GSM (Global System for Mobile communication) or GPRS (General Packet Radio Service) radio systems the subscriber equipment can use multiple slots during transmission, and the general trend is towards supporting a higher number of slots for one user.

The high energy consumption has obvious disadvantages in the subscriber equipment. The power amplifier consumes more current, resulting in harmful heating of not only the power amplifier but also the whole subscriber equipment. The excess heating may cause deviation from nominal operation of components, which is harmful to the communication in the radio system.

If subscriber equipment supports single timeslot transmission in uplink direction, it may have been designed to withstand power consumption that represents single timeslot case. When multiple timeslots are to be supported the power consumption is significantly higher and may cause severe problems e.g. due to excess heat. Additionally, the increased energy consumption empties the battery of the subscriber equipment faster, leading to a more frequent need of loading and, in lack of that, to loss of operation.

To overcome the problems with excess heat in the use of multiple timeslots, a simple approach is to divide the used power with number of used timeslots in uplink transmission. This approach leads to equal power consumption when compared to single timeslot case with full power. However, this approach affects performance range as the user equipment always operates with decreased output power when multislot operation is enabled. In addition to that the scheme is suboptimal as it does not take the discontinuity of transmission into account.

When a radio link is utilized to carry packet data traffic, the transmission occurs typically in short bursts. Because of bursts it is possible to use higher peak power levels as the average power level remains low. The average power levels depend on the application and the data profile. In a typical application data is sent in shorter bursts with inactivity periods in the middle of the data transfer. This discontinuous nature can be taken into account in tuning the power level of subscriber equipment. However, there are also applications that involve longer continuous transmission, in which case the average power levels is closer to peak power levels. For these applications, if activity of transmission is taken into account in power reduction, the average power levels also decrease.

BRIEF DESCRIPTION OF THE INVENTION

An object of the invention is to provide an improved method and subscriber equipment, which take the discontinuity of the transmission properly into account. According to an aspect of the invention, there is provided a method of controlling transmission power in subscriber equipment of a radio system, the method comprising: transmitting bursts by a transmitter of the subscriber equipment, the transmitter being capable of transmitting the bursts with different activity, forming an average activity of the transmitter, and controlling the transmission power of the bursts as a function of the average activity of the transmitter.

According to another aspect of the invention, there is provided a subscriber equipment of a radio system, the subscriber equipment comprising a transmitter configured to transmit bursts, the transmitter being capable of transmitting the bursts with different activity. The subscriber equipment is configured to form an average activity of the transmitter, and control the transmission power of the bursts as a function of the average activity of the transmitter.

Preferred embodiments of the invention are described in the dependent claims.

The method and subscriber equipment of the invention provide several advantages. In a preferred embodiment of the invention the relation of discontinuity of the transmission and the transmission power can be effectively taken into account in a smooth way which gives time for the radio link management to adapt to reducing power level if multislot transmission continues so long time that the power reduction has significant effect on the output power.

LIST OF DRAWINGS

Figure 2A:
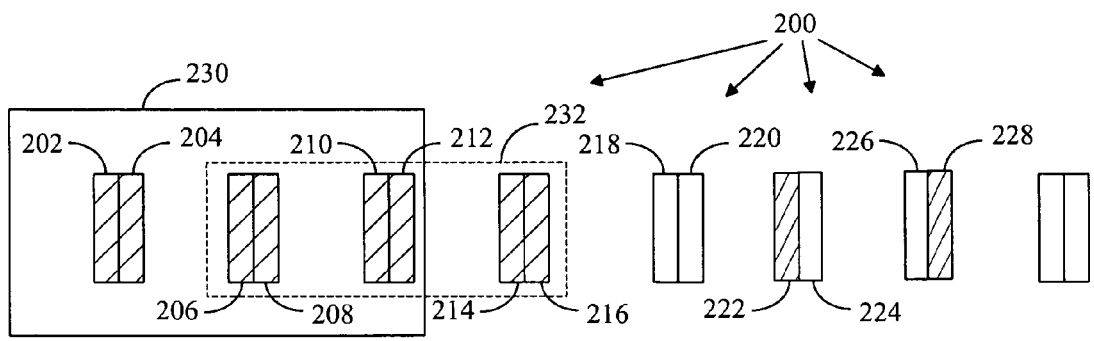
Figure 2B:
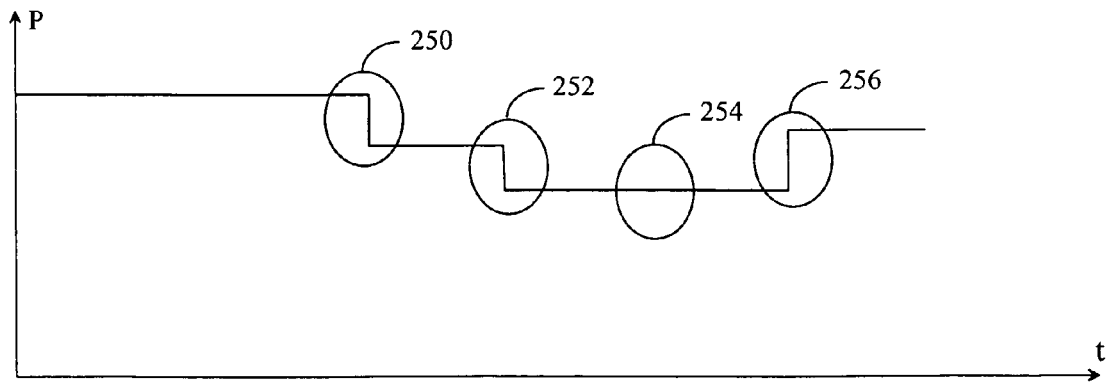
Figure 3:
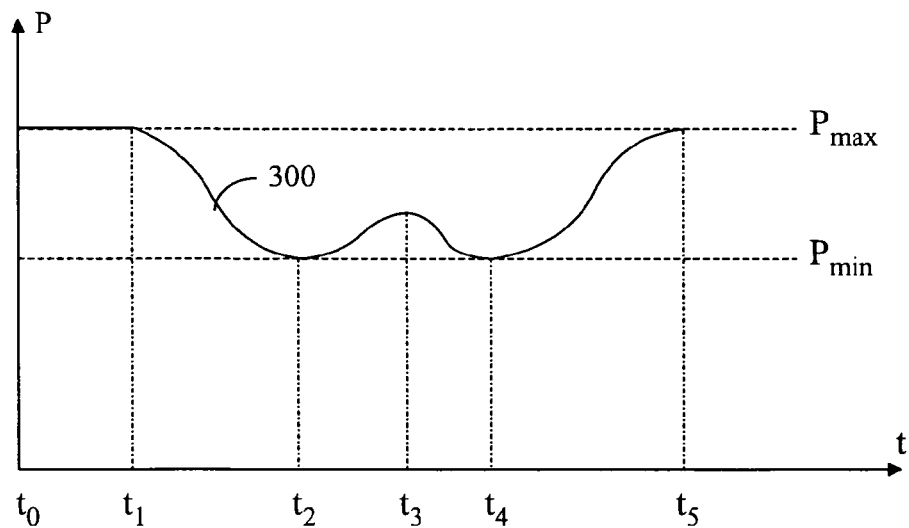
Figure 4:
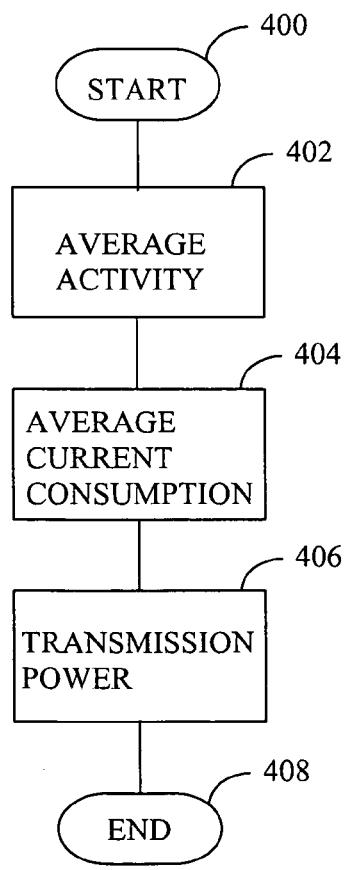
Figure 5:
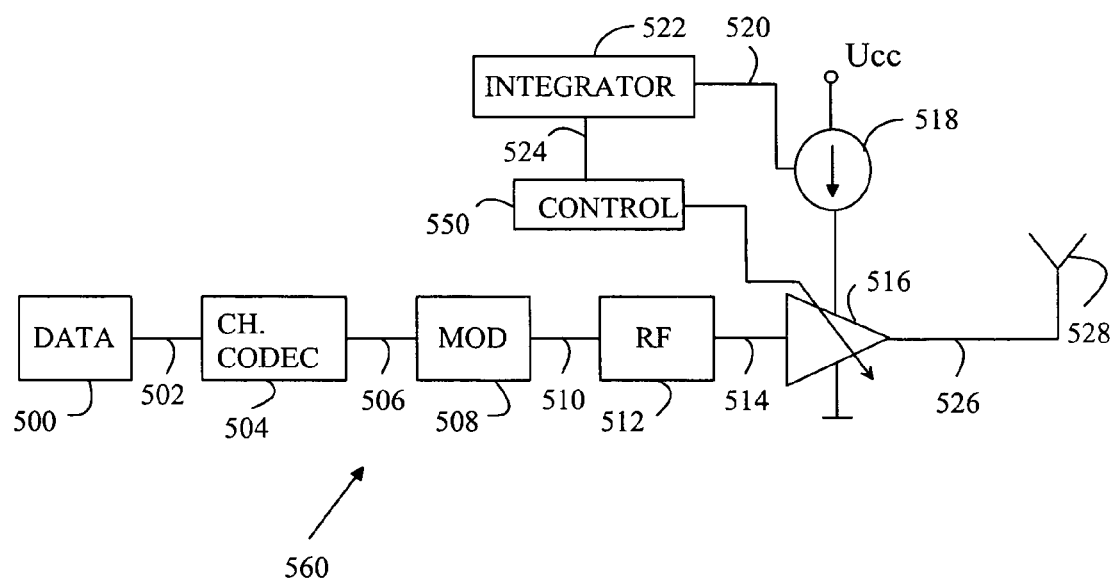
Figure 6:
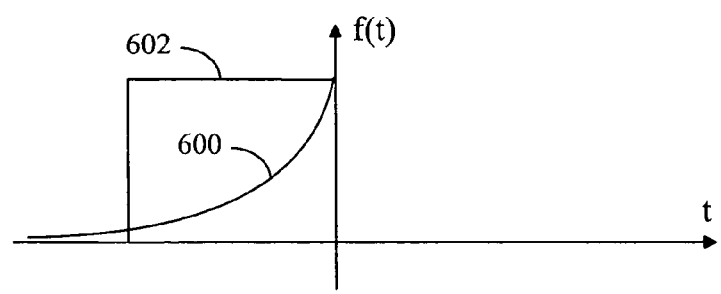

In the following, the invention will be described in greater detail with reference to the preferred embodiments and the accompanying drawings, in which FIG. 1 shows a block chart of a radio system, FIG. 2A illustrates usage of TDMA time slots, FIG. 2B illustrates transmission power with respect to the TDMA time slots in FIG. 2A, FIG. 3 illustrates control of transmission power, FIG. 4 illustrates flow chart of the method, FIG. 5 illustrates a transmitter of subscriber equipment, and FIG. 6 represents a weight function used as a time window.

DESCRIPTION OF EMBODIMENTS

The present solution is well-suited for use in a TDMA based radio system, the invention being, however, not restricted to them. The present solution can be applied in any radio system where the transmission of a transmitter is not fully continuous but the transmission takes place at least partly in bursts of constant or non-constant duration.

First the radio system is described by means of FIG. 1. A typical digital radio system comprises subscriber equipment 100 to 104, at least one base station 106, and a base station controller 108, which can also be called as a radio network controller. The subscriber equipment 100 to 104 communicates with the base station 106 using signals 110 to 114. The base station 106 can be connected to the base station controller 108 by a digital transmission link 116. The subscriber equipments 100 to 104 may be fixedly installed terminals, user equipment installed in a vehicle or portable mobile terminals. The signals 110 to 114 between the subscriber equipment 100 to 104 and the base station 106 carry digitized information, which is e.g. speech or data information produced by subscribers or control information produced by the radio system.

In a time division multiple access radio system or in a general packet radio system, signals are transmitted using slots. The transmission of bursts takes place in time slots. Since the present tendency is towards higher data rates, a higher number of time slots per TDMA frame can used for one user. On the other hand, the subscriber equipment may be designed to withstand full transmission power only in a single time slot usage per TDMA frame as a continuous data transfer. It is also laborious to design a power amplifier and its cooling for transmission using a high number of time slots for a long time.

The activity of the transmitter depends on the duration of a burst, the frequency of transmission of bursts, number of time slots used, and the transmission power. The transmission can be considered continuous, if the transmitter transmits in every frame although between every slot there may be an actual discontinuity. A discontinuity of transmission is considered to take place when a transmitter does not transmit in a frame at all.

Let us now study an embodiment based on multislot allocation according to FIG. 2A and FIG. 2B. In this exemplary case transmissions 200, during which subscriber equipment is actively transmitting, can take place in pairs of time slots 202 to 228, in which the transmitter transmits electromagnetic radiation. The transmitter may also be capable of changing the duration and frequency of the bursts. The frequency of bursts can be changed by changing the frequency of time slots in use. The transmitter can also use more than two time slots to transmit in one frame. The time slots can be successive or non-successive. For example, in the pair of time slots 218 and 220 the transmitter is not transmitting at all, and in the pair of time slots 222, 224 and 226, 228 the transmitter is transmitting only in the time slots 222 and 226. In an embodiment the subscriber equipment controls the transmission power based on the activity with which the bursts are transmitted and the used power level of the bursts. To obtain relative information on discontinuity of the transmissions, the duration of transmission of bursts with respect to the duration of non-transmission relating to the corresponding bursts transmitted can be detected. The detection can be performed, for example, by integrating the transmission activity over a predetermined period of time $T_{det}$ 230. The predetermined period of time 230 can be a fixed or a sliding window. The next predetermined period of time 232 with respect to the present predetermined period of time 230 is shown using a dashed block. Finally, according to the solution, the transmission power of each burst can be controlled as a function of the activity of the subscriber equipment and the power level. The control can be based on a dynamic algorithm.

FIG. 2B shows transmission power P as a function of time t. Transmission power P is in the y-axis and time is in the x-axis, both of the axes being in arbitrary scale. Since the subscriber equipment has used all possible time slots during the predetermined period of time in the time slots 202-212, the transmission power is decreased at the moment 250. The transmission power is again reduced at the moment 252 because of continued use of full multiple time slots 204-216. The transmission power is not changed at the moment 254 because the average usage of time slots 210-220 is still high. The transmission power is increased at the moment 256 because the usage of time slots 214-224 is lowered. According to the present solution, the transmission power can be decreased, kept constant or increased depending on the activity factor and the transmission power at the moment of applying the control action. If the time window is long when compared to the frame duration, the power control can be very smooth, i.e. small fraction of the normally used power control step.

Another way to detect the activity of the transmitter is to count the number of time slots having active transmissions in a number of TDMA frames during the predetermined period of time. The transmission power can then be adjusted as a function of the used time slots in the predetermined period of time. In a TDMA system the predetermined period of time $T_{det}$ can be, for example, the same as the duration of the super frame (6.12 s) including 26 hyper frames and 1326 TDMA frames. If the subscriber equipment is transmitting in 2652 time slots during the predetermined period of time $T_{det}$ (corresponding to the super frame), the average activity factor AF is then AF=2652/1326=2, which means that on average the subscriber equipment is transmitting in 2 time slots in one TDMA frame.

On the other hand, if the subscriber equipment is transmitting in 700 time slots during the predetermined period of time $T_{det}$ (corresponding to the super frame), the average activity factor AF is then AF=700/1326=0.53, which means that on average the subscriber equipment is not using even one time slot for transmission, but transmitting on average in only every 0.53 time slots in one TDMA frame if the output power level keeps constantly at the maximum. According to the present solution, the transmission power can be decreased if the activity of the transmitter AF is high, and the transmission power can be increased if the activity of the transmitter is low. The change can depend on the activity such that, for example, the steepness of the decrease of the transmission power depends on the highness of the activity, i.e. the higher the activity, the faster can the transmission power be decreased. The output power can be linearly controlled between a maximum peak and a minimum value which the transmitter can handle with continuous multislot transmission.

All in all, the activity of the transmitter can be considered similar to duty cycle defining the proportion of time during which the transmitter is transmitting. The activity as a duty cycle expresses a ratio or a percentage of transmitting time versus non-transmitting time or transmitting time versus non-transmitting and transmitting time. The latter ratio, however, depends on the ratio of transmitting time versus non-transmitting time. The power consumption of the transmitter can also be taken into account in determining the activity. The power consumption can be measured, by for example, measuring the current consumption.

FIG. 3 presents an example of how transmission power of the transmitter can be decreased and increased depending on the actual transmission power and the combined average duration of bursts with respect to the corresponding time when there is no transmission on. The y-axis represents the value of transmission power P and the x-axis represents time t in arbitrary units. The time scale is larger than in FIG. 2B, and hence the steps of adjustments of the transmission power are not shown. The transmission power in this example is limited such that the power has an absolute maximum value $P_{max}$ and an absolute minimum value $P_{min}$. Assume that the transmitter transmits as actively as possible at moment $t_1$ and it continues till moment $t_2$. The curve 300 shows in FIG. 3 that although at first between $t_0$ and $t_1$ the transmission power is at its maximum and the relative duration of non-transmission is small, it is possible that the transmission power is not changed. The predetermined delay between $t_0$ and $t_1$ may be, for example, 4 minutes or any other limited period because it is assumed that the amplifier can stand high current consumption for a short time. The delay, however, is not necessary. The transmission power is decreased between moments $t_1$ and $t_2$, because the activity of the transmitter continues. The decrease of the transmission power can then be performed according to a suitable function. Instead of being linear, which is also possible, the decrease can be non-linear such that the slope of decrease is gentle at first but becomes steeper if the transmitting activity is kept high. The slope of decrease may become less intense again when the transmission power approaches the minimum value $P_{min}$. In the example of FIG. 3 the transmission activity decreases, resulting in an increase of transmission power between moments $t_2$ and $t_3$. But because of a new increase in the transmission activity, the transmission power is decreased again between moments $t_3$ and $t_4$. When the transmitter lowers radically the transmission activity, the transmission power is increased upto the maximum $P_{max}$ accordingly between moments $t_4$ and $t_5$.

FIG. 4 shows a flow chart of an embodiment. In step 400 the method starts. In step 402 an average activity of the transmitter is formed. In step 404 an average current consumption of a power amplifier of the transmitter is measured. In step 406 transmission power of the bursts is controlled as a function of the average activity and the average current consumption of the transmitter. In step 408 the method ends.

Finally, FIG. 5 shows the main parts of the transmitter 560 of the subscriber equipment relating to the present solution. The receiver of the subscriber equipment is of no importance, and hence it is not illustrated. The transmitter comprises a data source 500, which may be a voice encoder or some other data source. A signal 502 from the data source 500 is applied to a channel encoder 504, which increases redundancy in the digital data stream of the signal. The encoded symbols 506 are then applied to a modulator 508, which modulates the signal by converting the discrete code symbols into channel waveforms in a known manner. The modulated signal 510 is applied to a radio frequency unit 512, in which the signal is mixed into a radio frequency. It is not, however, important what means are used or how the signal is processed before the transmission power control.

The RF signal 514 from the radio frequency unit 512 is then amplified by a power amplifier 516, the amplification of which can be adjusted. The amplification of the power amplifier 516 determines the power consumption of the transmitter. The current fed from the electrical power source $U_{cc}$ supplying the operational voltage to the amplifier 516 is detected by a sensor 518. In the simplest case the sensor 518 detects only whether current is supplied or not to the amplifier, but the sensor 518 is not necessarily used to detect the strength of the current. However, additionally the current consumption can be measured if the sensor 518 also detects the current strength. The detection of the current flow relates to the activity of the transmitter because the amplifier typically consumes current only when the transmitter is transmitting. Hence, the activity is increased when the duration of burst becomes longer or when the bursts are transmitted more frequently. That can also be expressed such that the increasing number of the time slots increases also the activity. The sensor 518 feeds a signal 520 including the detected information on current to the integrator 522.

Integration in the integrator 522 to form the average activity AF can be formed as:

$$AF=\int_{-T_1}^{T_2} f(t)dt/(T_2-(-T_1)), \quad (1)$$

where the time between $-T_1$ and $T_2$ is the predetermined period of time and f(t) is constant, for example 1, when current is supplied to the power amplifier (the transmitter is transmitting) and f(t) is 0 when no current is supplied to the amplifier (the transmitter is not transmitting). The positive instant $T_2$ is usually the same as current time $T_C$ and can be set 0. In this case the sensor 518 detects only whether current is supplied or not, but the sensor 518 is not used to detect the strength of the current. The actual division by $(T_2-(-T_1))$ is not necessary, particularly if the predetermined period of time is constant.

The average activity AF can also be formed by integrating from negative infinity to current time $T_C$ and having a weight function w(t) which defines a limited or limitless time window. That can be expressed mathematically as:

$$AF=\int_{-\infty}^{T_C} w(t)f(t)dt, \quad (2)$$

where w(t) is a weight function.

The integrator 522 can form the current consumption CC of the amplifier if the sensor can also detect the strength of the current:

$$CC=\int_{-T_1}^{T_2} i\,dt, \quad (3)$$

where i is the current input to the amplifier 516. The positive instant $T_2$ is usually the same as current time $T_C$ and can be set 0. The current consumption can also be formed by integrating from negative infinity to current time $T_C$ and having a weight function which defines a limited or limitless time window. That can be expressed mathematically as:

$$CC=\int_{-\infty}^{T_C} p(t)i\,dt, \quad (4)$$

where p(t) is a weight function.

The weight function in the formulas (2) and (4) can have the shapes shown in FIG. 6, without being, however restricted to them. The y-axis represents a value of the weight function and the x-axis represents time t. The origin is the present moment and the negative time scale means the past time. The values of the weight function can decrease slowly as a function of time as the curve 600 shows. That means that the older the current value is the less it has effect on the integration and on activity AF. The values of the weight function can also form a step function as the curve 602 shows, the result of integration then being similar to the integral in formulas (1) and (3).

The signal 524 formed by the integrator 522 can be fed to a controller 550 which controls the amplification of the amplifier 516. The signal 524 can also be fed straight to the amplifier 516 and used as an amplification control signal (not shown in FIG. 5).

A change in the amplification can be achieved, for instance, by attenuating or amplifying the small amplitude signal 514 prior to the actual amplification in the amplifier 516, which can then have a constant amplification. The amplification itself can also be changed in various ways known per se by a person skilled in the art. For instance, a way to adjust the amplification is to control the bias current fed to the amplifier 516.

The amplified signal 526 proceeds to an antenna 528 which emits the signal. There may be additional amplification of the signal 526 between the amplifier 516 and the antenna 528.

Even though the invention is described above with reference to examples according to the accompanying drawings, it is clear that the invention is not restricted thereto but it can be modified in several ways within the scope of the appended claims.

The invention claimed is:

1. A method comprising:
    transmitting bursts by a transmitter of a subscriber equipment of a radio system, the transmitter being capable of transmitting the bursts with different activity,
    forming an average activity of the transmitter, and
    controlling transmission power of the bursts as a function of the average activity of the transmitter.

2. The method of claim 1, the method further comprising
    measuring an average current consumption of a power amplifier of the transmitter, and
    controlling the transmission power of the transmitter additionally with the average current consumption of the amplifier.

3. The method of claim 1, the method further comprising measuring the average transmission power level and taking the measured transmission power level into account in forming the average activity of the transmitter.

4. The method of claim 1, the method further comprising
    forming the average activity using duration of transmission of bursts with respect to duration of non-transmission relating to the corresponding bursts transmitted.

5. The method of claim 1, the method further comprising forming the average activity as a ratio of duration of transmission and duration of non-transmission of the transmitter during a predetermined period of time.

6. The method of claim 1, the method further comprising forming the average activity as a relative duration of transmission in a predetermined period of time.

7. The method of claim 1, the method further comprising controlling the transmission power such that the transmission power is increased with the decreasing activity of the transmitter, and controlling the transmission power such that the transmission power is decreased with the increasing activity of the transmitter.

8. The method of claim 1, the method further comprising delaying the controlling of the transmission power by a predetermined delay.

9. Subscriber equipment of a radio system, the subscriber equipment comprising a transmitter configured to transmit bursts, the transmitter being capable of transmitting the bursts with different activity, wherein the subscriber equipment is configured to
    form an average activity of the transmitter, and
    control the transmission power of the bursts as a function of the average activity of the transmitter.

10. The subscriber equipment of claim 9, wherein the subscriber equipment is configured to
    measure an average current consumption of a power amplifier of the transmitter, the amplification of the power amplifier determining the transmission power of the transmitter, and
    control the transmission power of the transmitter additionally with the average current consumption of the amplifier.

11. The subscriber equipment of claim 9, wherein the subscriber equipment is configured to
    measure the average transmission power level and the subscriber equipment is configured to take the measured transmission power level into account in forming the average activity of the transmitter.

12. The subscriber equipment of claim 9, wherein the subscriber equipment is configured to
    form the average activity as a ratio of duration of transmission and duration of non-transmission of the transmitter during a predetermined period of time.

13. The subscriber equipment of claim 9, wherein the subscriber equipment is configured to
    form the average activity using duration of transmission of bursts with respect to duration of non-transmission relating to the corresponding bursts transmitted.

14. The subscriber equipment of claim 9, wherein the subscriber equipment is configured to control the transmission power such that the transmission power is increased with the decreasing activity of the transmitter, and the transmission power is decreased with the increasing activity of the transmitter.

15. The subscriber equipment of claim 9, wherein the subscriber equipment is configured to form the average activity as a ratio of duration of transmission in a predetermined period of time.

16. The subscriber equipment of claim 9, wherein the subscriber equipment is configured to delay the controlling of the transmission power by a predetermined delay.

\* \* \* \* \*

UNITED STATES PATENT AND TRADEMARK OFFICE
CERTIFICATE OF CORRECTION

PATENT NO. : 7,474,902 B2  Page 1 of 1
APPLICATION NO. : 10/869674
DATED : January 6, 2009
INVENTOR(S) : Vimpari et al.

It is certified that error appears in the above-identified patent and that said Letters Patent is hereby corrected as shown below:

Title Page item 30 in the Foreign Application Priority Data:

Page 1, Col. 1: "03101777" should read --03101777.5--.

Signed and Sealed this

Twenty-third Day of February, 2010

David J. Kappos
*Director of the United States Patent and Trademark Office*